(12) United States Patent
Coffy et al.

(10) Patent No.: US 11,437,306 B2
(45) Date of Patent: Sep. 6, 2022

(54) ELECTRONICS UNIT WITH INTEGRATED METALLIC PATTERN

(71) Applicant: STMicroelectronics (Grenoble 2) SAS, Grenoble (FR)

(72) Inventors: Romain Coffy, Voiron (FR); Fabien Quercia, Isere (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 17/165,295

(22) Filed: Feb. 2, 2021

(65) Prior Publication Data
US 2021/0242115 A1 Aug. 5, 2021

(30) Foreign Application Priority Data
Feb. 4, 2020 (FR) .................................... 2001103

(51) Int. Cl.
| | |
|---|---|
| *H01L 23/498* | (2006.01) |
| *H01L 21/48* | (2006.01) |
| *H01L 23/552* | (2006.01) |
| *H01L 23/66* | (2006.01) |
| *H01L 23/00* | (2006.01) |
| *H01Q 1/22* | (2006.01) |

(52) U.S. Cl.
CPC .... *H01L 23/49811* (2013.01); *H01L 21/4817* (2013.01); *H01L 21/4853* (2013.01); *H01L 23/552* (2013.01); *H01L 23/66* (2013.01); *H01L 24/48* (2013.01); *H01Q 1/2283* (2013.01); *H01L 2223/6677* (2013.01); *H01L 2224/48227* (2013.01)

(58) Field of Classification Search
CPC ...................... H01L 23/552; H01L 2223/6677
See application file for complete search history.

(56) References Cited

U.S. PATENT DOCUMENTS

| | | | |
|---|---|---|---|
| 9,508,658 B1 | 11/2016 | Convert et al. | |
| 2012/0061816 A1* | 3/2012 | Song ................... | H01L 23/3677 257/E23.079 |
| 2013/0323408 A1* | 12/2013 | Read ..................... | H01L 21/561 118/697 |
| 2017/0025363 A1 | 1/2017 | Tsai et al. | |
| 2018/0130755 A1 | 5/2018 | Lee et al. | |
| 2021/0375783 A1* | 12/2021 | Chiu ....................... | H01L 24/32 |

OTHER PUBLICATIONS

INPI Search Report and Written Opinion for FR 2001103 dated Jun. 29, 2020 (10 pages).

* cited by examiner

*Primary Examiner* — Yu-Hsi D Sun
(74) *Attorney, Agent, or Firm* — Crowe & Dunlevy

(57) ABSTRACT

A non-conductive encapsulation cover is mounted on a support face of a support substrate to delimit, with the support substrate, an internal housing. An integrated circuit chip is mounted to the support substrate within the internal housing. A metal pattern is mounted to an internal wall of the non-conductive encapsulation cover in a position facing the support face. At least two U-shaped metal wires are provided within the internal housing, located to a side of the integrated circuit chip, and fixed at one end to the metallic pattern and at another end to the support face.

14 Claims, 3 Drawing Sheets

ELECTRONICS UNIT WITH INTEGRATED METALLIC PATTERN

PRIORITY CLAIM

This application claims the priority benefit of French Application for Patent No. 2001103, filed on Feb. 4, 2020, the content of which is hereby incorporated by reference in its entirety to the maximum extent allowable by law.

TECHNICAL FIELD

Embodiments and applications relate to microelectronics and, in particular, to the field of electronics units and particularly that of electronics units comprising a non-conductive encapsulation cover mounted on a support substrate and incorporating an antenna.

BACKGROUND

A support substrate is typically used for supporting and connecting one or more electronic integrated circuit chips and possibly components of the surface mounted device (SMD) type. A non-conductive encapsulation cover is used, in particular, for enclosing the electronic integrated circuit chip and other possible components and thus arranging a device or unit which is able to be manipulated and is protected from external conditions.

The mounting of the non-conductive encapsulation cover to the support substrate conventionally comprises arranging a strip of adhesive, for example on the periphery of the bearing surface of the support substrate, and joining together the cover and the substrate by contacting the strip of adhesive.

The incorporation of an antenna into the unit is increasingly demanded by users, particularly for future radiofrequency applications, for example 5G but by no means limited to 5G applications, that require a high degree of integration.

Current solutions provide the formation of the antenna on the bearing surface of the support substrate by depositing a specific metal or even by soldering the cover to the substrate.

Such solutions lead to an increase in the size of the units and/or to an increase of the manufacturing costs.

It is thus necessary to propose a different solution for incorporating an antenna into a unit which does not have a negative impact on the bulkiness of the surface and/or on the manufacturing costs.

SUMMARY

According to one embodiment, it is proposed to use U-shaped metal wires, which makes it possible to connect a metallic pattern arranged on the internal face of the cover to the bearing surface of the substrate. This makes it possible to either: form an antenna and connect it in a simple manner to a component located on the bearing surface of the substrate; or form an electromagnetic protective shield that can thus be arranged as close to the component as possible. A plurality of U-shaped metal wires can be arranged, for example, around the electronic integrated circuit chip so as to form a network that is as dense as possible in order to ensure good electromagnetic protection.

Furthermore, the formation of said U-shaped metal wires can be carried out advantageously in the same way as the formation of wire bonding between the electronic integrated circuit chip and the substrate, which does not require a different manufacturing process.

According to one aspect, a unit or device is proposed, comprising: a support substrate having a bearing surface; a non-conductive encapsulation cover mounted on said bearing surface of the support substrate and delimiting with the support substrate an internal housing of the unit; at least one electronic integrated circuit chip located in the internal housing and supported by said bearing surface; a metallic pattern arranged at least on an internal wall of the non-conductive encapsulation cover located opposite the bearing surface; and a plurality of U-shaped metal wires extending into said internal housing, to the side of said at least one electronic integrated circuit chip, being fixed on the one hand to the metallic pattern and on the other hand to the bearing surface.

The expression "U-shaped" should be interpreted very broadly to include any curved structure with two branches, even if this structure is not exactly U-shaped.

According to one embodiment, the bend of each U-shaped metal wire can be fixed onto the metallic pattern and the two legs of each U-shaped metal wire can be fixed onto the bearing surface.

In one variant, it is possible to fix the two legs of the U-shaped metal wire onto the metallic pattern, the bend of the U-shaped metal wire being fixed onto the bearing surface.

The use of U-shaped metal wires is compatible with all methods of mounting the electronic integrated circuit chip onto the bearing surface.

Thus, it is of course possible to mount the electronic integrated circuit chip by means of connecting balls soldered onto the bearing surface and coated with an underfill material.

That being said, it is also possible to use another conventional mounting method, which is known per se, of the electronic integrated circuit chip onto the bearing surface of the substrate comprising soldered wire bonding between the metallic pads of said at least one electronic integrated circuit chip and metal areas located on the bearing surface of the support substrate.

In this case, the U-shaped metal wires are structurally identical to these bonding wires which are obtained advantageously by an identical method.

According to one embodiment, the unit comprises an antenna including the metallic pattern and a connector, making it possible to connect said antenna to at least one component located on said bearing surface, said connector including at least two U-shaped metal wires.

These two U-shaped metal wires thus make it possible to connect the two terminals of the antenna to a component or to a circuit located on the bearing surface of the unit, for example a circuit for adapting the impedance.

According to another possible embodiment, the unit can include a plurality of U-shaped metal wires arranged at the periphery of the internal housing and surrounding said at least one electronic integrated circuit chip.

The unit can thus include an electromagnetic protective shield including said metallic pattern and said U-shaped metal wires arranged at the periphery of the internal housing.

According to another aspect, a method for forming a unit comprises: providing a support substrate having a bearing surface; mounting at least one electronic integrated circuit chip on the bearing surface (the term "mounting" should be interpreted very broadly here, including not only fixing the electronic integrated circuit chip onto the bearing surface but also the formation of its connector, for example by means of connecting balls coated with an underfill material or even the formation of wire bonding and soldering thereof); fixing a plurality of U-shaped metal wires onto the bearing surface, projecting to the side of said at least one electronic integrated circuit chip; providing a non-conductive encapsulation cover; forming a metallic pattern at least on the internal wall of the cover designed to be opposite the bearing surface after mounting the cover on the bearing surface; locally forming soldering means, for example soft pads of soldering paste, onto said metallic pattern; mounting the non-conductive encapsulation cover onto said bearing surface of the support substrate such that the projecting ends of the U-shaped metal wires come into contact with the localized soldering means; and raising the temperature of the unit, for example by heating in an oven, so as to solder the projecting ends of the U-shaped metal wires onto the metallic pattern.

According to another aspect, a method for forming a unit comprises: providing a support substrate having a bearing surface; mounting at least one electronic integrated circuit chip on the bearing surface; locally forming soldering means, for example soft pads of soldering paste, on said bearing surface, to the side of said at least one electronic integrated circuit chip; providing a non-conductive encapsulation cover; forming a metallic pattern at least on the internal wall of the cover designed to be opposite the bearing surface after mounting the cover on the bearing surface; fixing a plurality of projecting U-shaped metal wires onto the metallic pattern designed to extend to the side of said at least one electronic integrated circuit chip after mounting the cover on the bearing surface; mounting the non-conductive encapsulation cover onto said bearing surface of the support substrate in such a manner that the projecting ends of the U-shaped metal wires come into contact with localized soldering means; and raising the temperature of the unit so as to solder said projecting ends of the U-shaped metal wires onto said bearing surface.

In one or other of these other aspects, the projecting ends of the U-shaped metal wires are advantageously the bends of the U-shaped metal wires.

BRIEF DESCRIPTION OF THE DRAWINGS

Other advantages and features of the invention are described in the detailed description of embodiments and applications, which are by no means limiting, and the attached drawings in which.

DETAILED DESCRIPTION

Figure 1:
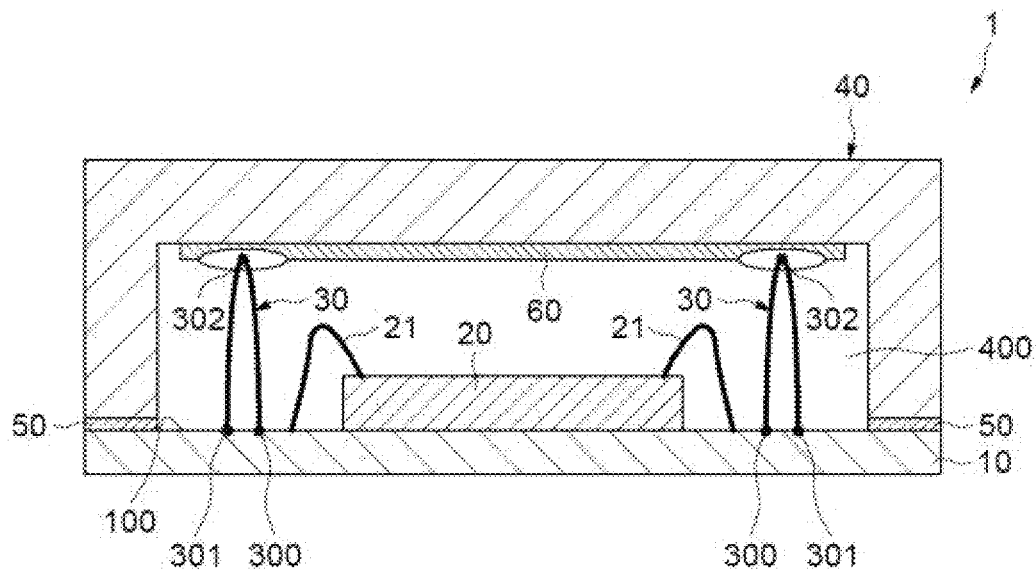
FIG. 1 is schematic diagram of a unit or device.

In FIG. 1, reference numeral 1 denotes a unit or device comprising a support substrate 10 having a bearing surface 100 and a non-conductive encapsulation cover 40 mounted on the bearing surface 100 by means of a strip of adhesive 50, having a thickness commonly referred to by a person skilled in the art as the bond line thickness (BLT).

The adhesive is a known epoxy adhesive, for example.

Typically, the thickness of this strip of adhesive 50 is limited in quantity to maintain a given position of vertical positioning of the cover on the substrate. For example, to maintain a precision of the vertical positioning of more or less 10 micrometers, the thickness of the strip of adhesive is capped at 15 micrometers.

The support substrate 10 is designed to support at least one electronic integrated circuit chip 20 and to establish electrical connections between the terminals of the electronic integrated circuit chip and the exterior of the unit 1.

The internal wall of the non-conductive encapsulation cover 40 delimits with the carrier substrate 10 an internal housing (or volume) 400 designed to receive the electronic integrated circuit chip 20.

In the example illustrated in FIG. 1, the electronic integrated circuit chip 20 is electrically connected to metallic areas of the bearing surface 100 of the support substrate by connecting wires 21.

The non-conductive encapsulation cover 40 also includes, on its internal wall located opposite the bearing surface 100 of the support substrate (i.e., on an underside of the front wall of the cover 40), a metallic pattern 60 which can be, for example, either: a solid metal plate in the case of an electromagnetic protective shield, or a specific metal pattern in the case of the formation of an antenna.

In this embodiment, U-shaped metal wires 30 are also provided within the internal housing 400, located to the side of the electronic integrated circuit chip 20, and extending between the bearing surface 100 of the support substrate and the metallic pattern 60.

In this embodiment, the bend of each U-shaped metal wire is located at the level of the metallic pattern and is fixed to the metallic pattern by means of an electroconductive soldering paste 302.

Two legs 300 and 301 of each U-shaped metal wire extend from the bend and are fixed, for example by soldering, onto the metallic areas of the bearing surface 100 of the support substrate.

Figure 2:
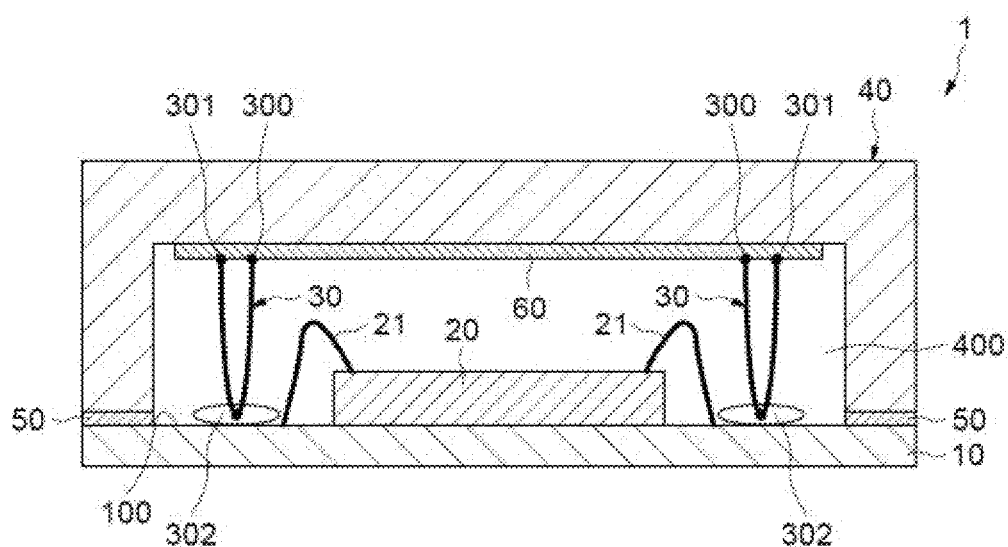
FIG. 2 is schematic diagram of a unit or device.

In the embodiment variant illustrated in FIG. 2, this time the bends of the U-shaped metal wires are fixed onto the bearing surface of the support substrate by means of soldering pads 302. Furthermore, the legs 300 and 301 of the U-shaped metal wires are soldered onto the metallic pattern 60.

Figure 3:
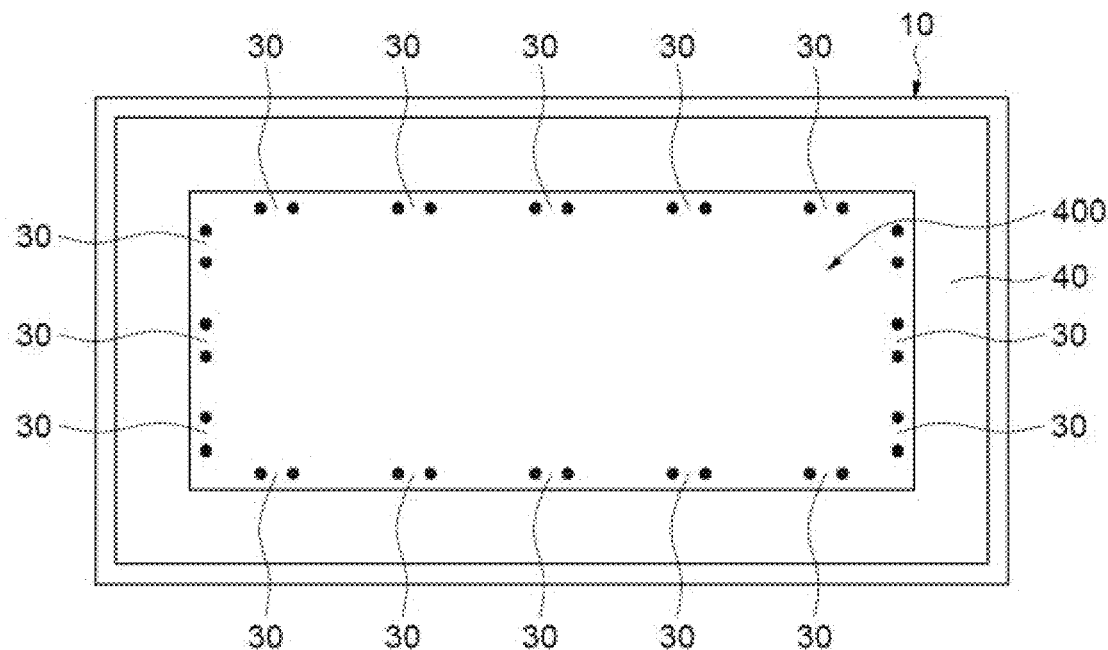
FIG. 3 is a plan view.

It is possible advantageously, as illustrated very schematically in the plan layout of FIG. 3, to provide a plurality of U-shaped metal wires 30 arranged at the periphery of the internal housing 400 of the unit and therefore surrounding the electronic integrated circuit chip or chips located in the unit as well as all the other possible components.

This is particularly advantageous in the case of an electromagnetic shield and makes it possible to obtain a dense peripheral network or curtain of U-shaped metal wires.

Figure 4:
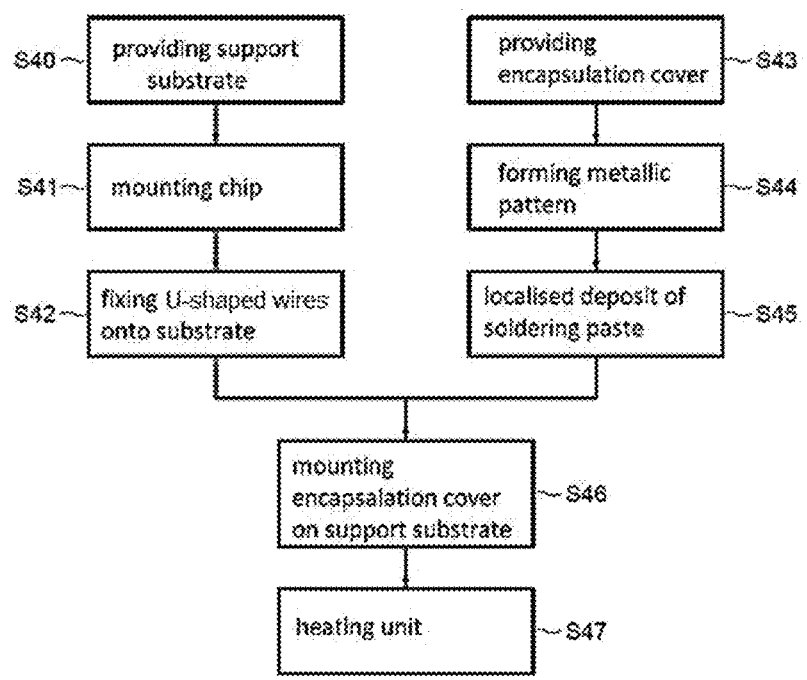
FIG. 4 shows steps of a method.
Figure 5:
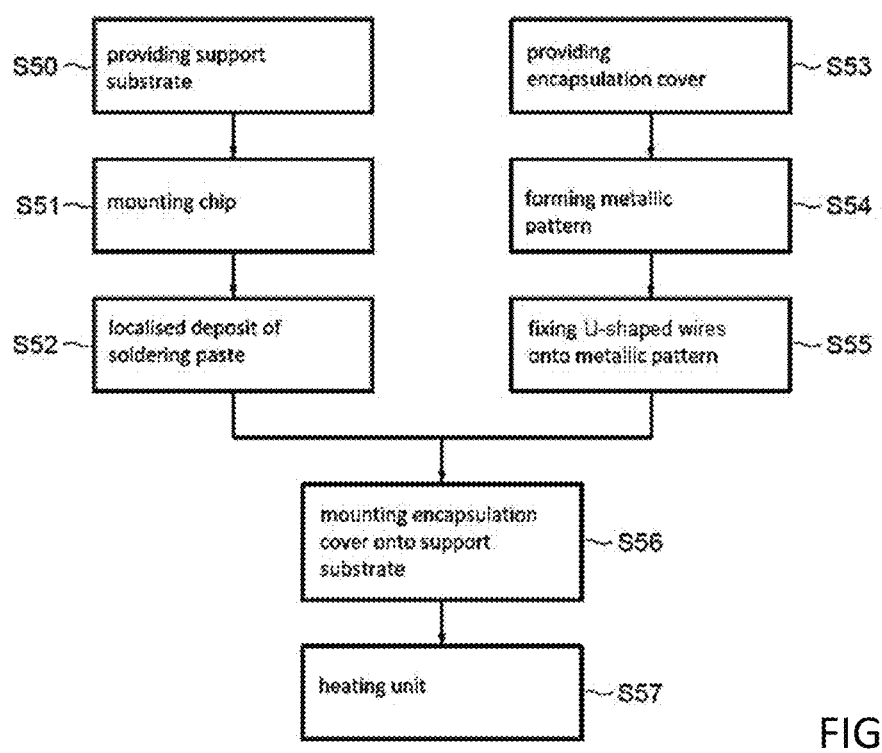
FIG. 5 shows steps of a method.

Reference is now made in particular to FIGS. 4 and 5 to illustrate ways of implementing the method of manufacturing the unit.

FIG. 4 refers more particularly to an implementation which makes it possible to obtain a unit of the type illustrated in FIG. 1, whereas FIG. 5 refers more particularly to a method of implementation which makes it possible to obtain a unit of the type illustrated in FIG. 2.

In step S40 of FIG. 4, the support substrate is provided, on which in step S41 the mounting of the electronic integrated circuit chip is performed, including fixing the electronic integrated circuit chip as well as forming its electrical connection, for example by means of connecting wires 21.

Then, in step S42, the formation and fixing of U-shaped metal wires 30 is performed on the metallic areas of the substrate.

The method of forming said wires in a U shape is identical to that of forming the connecting wires 21 of the electronic integrated circuit chip. In particular, use of bonding wire technology and fabrication techniques may be used for both the connecting wires 21 and U-shaped metal wires 30.

More precisely, conventionally, a wire is arranged having a ball at its end which is crushed onto a first metallic area of the substrate.

Then the wire is shaped in order to obtain the U-shape and the end of the other branch of the U-shaped metal wire is crushed onto another metallic area of the substrate which fixes it and severs the rest of the wire, then forms again a ball which will be used for forming another U-shaped metal wire.

Typically, the diameter of said U-shaped metal wires can vary between 20 and 25 micrometers.

Therefore, at the end of step S42, U-shaped metal wires are obtained which are fixed onto the bearing surface of the substrate and project from said bearing surface. The height of the wires in the U-shaped metal wire can vary between 500 and 1000 Angstroms.

In this way a very good degree of rigidity is obtained for the U-shaped metal wires and their flexibility makes it possible for them to easily withstand dilatation during the increase in temperature of the units.

Steps S43 to S45 are performed parallel to steps S40 and S42.

It should be noted here that, of course, said steps S43, S44 and S45 can be carried out before steps S40 to S42 or even after or even simultaneously to steps S40 to S42.

In step S43, the non-conductive encapsulation cover 40 is provided and the metallic pattern is formed on its internal wall, which is designed to be opposite the bearing surface after mounting the cover on the support substrate.

This metallic pattern can be formed or example by vapor phase metal deposition or by direct laser engraving known by the person skilled in the art as laser direct structuring (LDS).

Then, in step S45, a localized deposit of a soft soldering paste is performed onto the metallic pattern, for example a soft paste with a base of tin, silver and copper.

In step S46, the non-conductive encapsulation cover is mounted onto the support substrate. During this assembly the ends of the walls of the cover sink into the epoxy adhesive 50.

Likewise, during this assembly, the bends of the U-shaped metal wire sink into the soft pads of soldering paste 302.

Then the unit is heated S47.

During the heating, the adhesive 50 polymerizes, for example at 150° C., so as to ensure the adhesion of the cover.

Furthermore, the heating also enables the soft soldering paste to be heated to a high enough temperature, for example 260° C., to solder the U-shaped bend to the metallic pattern.

Referring now to FIG. 5, it is shown that this time the localized deposit of soldering paste is performed in step S52 on the bearing surface of the support after step S50 of providing the support substrate and step S51 of mounting the electronic integrated circuit chip.

With regard to the cover, the latter is provided in step S53 and the metallic pattern is formed in step S54.

Then, the U-shaped metal wires are fixed, for example by soldering, onto the metallic pattern in step S55.

This time there are U-shaped metal wires projecting from the internal wall of the unit.

And, when mounting the non-conductive encapsulation cover onto the support substrate in step S56, the projecting ends of the U-shaped metal wires enter into the pads of soldering paste, which enable said projecting ends to be fixed onto the metal areas of the support substrate during the heating S57 of the unit.

The invention claimed is:

1. A unit, comprising:
   a support substrate having a bearing surface;
   a non-conductive encapsulation cover mounted on said bearing surface of the support substrate and delimiting with the support substrate an internal housing of the unit;
   at least one electronic integrated circuit chip located in the internal housing and supported by said bearing surface;
   a metallic pattern arranged at least on an internal wall of the non-conductive encapsulation cover located opposite the bearing surface, wherein said metallic pattern forms an antenna; and
   a plurality of U-shaped metal wires provided within said internal housing, located to a side of said at least one electronic integrated circuit chip, and fixed at one end to the metallic pattern and at another end to the bearing surface to form a connector between the support substrate and the antenna.

2. The unit according to claim 1, wherein a bend of each U-shaped metal wire provides said one end that is fixed by a solder material to the metallic pattern and wherein ends of two legs of each U-shaped metal wire extending from the bend provide said another end that is fixed to the bearing surface.

3. The unit according to claim 1, wherein a bend of each U-shaped metal wire provides said another end that is fixed to the bearing surface and wherein ends of two legs of each U-shaped metal wire extending from the bend provide said one end that is fixed by a solder material to the metallic pattern.

4. The unit according to claim 1, further comprising connecting wires extending between metallic pads of said at least one electronic integrated circuit chip and metallic areas located on the bearing surface.

5. The unit according to claim 1, wherein the U-shaped metal wires are structurally identical to the connecting wires.

6. The unit according to claim 5, wherein the U-shaped metal wires and the connecting wires are formed by bonding wires.

7. The unit according to claim 1, wherein said plurality of U-shaped metal wires are arranged at the periphery of the internal housing and positioned surrounding said at least one electronic integrated circuit chip.

8. A unit, comprising:
   a support substrate having a bearing surface;
   a non-conductive encapsulation cover mounted on said bearing surface of the support substrate and delimiting with the support substrate an internal housing of the unit;
   at least one electronic integrated circuit chip located in the internal housing and supported by said bearing surface;
   a metallic pattern arranged at least on an internal wall of the non-conductive encapsulation cover located opposite the bearing surface, wherein said metallic pattern forms an antenna; and
   a plurality of electrical connectors provided within said internal housing and located to a side of said at least one electronic integrated circuit chip;
   wherein each electrical connector is formed by a connecting wire that is bent to define a first end with two legs extending from the first end to a second end; and
   wherein one of the first and second ends is fixed to the metallic pattern and the other of the first and second ends is fixed to the bearing surface.

9. The unit according to claim 8, wherein the first end is fixed by a solder material to the metallic pattern and the second end is fixed to the bearing surface.

10. The unit according to claim 8, wherein the first is fixed to the bearing surface and wherein the second end is fixed by a solder material to the metallic pattern.

11. The unit according to claim 8, further comprising connecting wires extending between metallic pads of said at least one electronic integrated circuit chip and metallic areas located on the bearing surface.

12. The unit according to claim 8, wherein the electrical connectors are structurally identical to the connecting wires.

13. The unit according to claim 12, wherein the electrical connectors and the connecting wires are formed by bonding wires.

14. The unit according to claim 8, wherein said electrical connectors are arranged at the periphery of the internal housing and positioned surrounding said at least one electronic integrated circuit chip.

* * * * *